United States Patent
Crowther et al.

(10) Patent No.: US 11,146,285 B2
(45) Date of Patent: *Oct. 12, 2021

(54) BATCH COMPRESSION MANAGEMENT OF MESSAGES

(71) Applicant: INTERNATIONAL BUSINESS MACHINES CORPORATION, Armonk, NY (US)

(72) Inventors: Fiona M. Crowther, Lancashire (GB); Geza Geleji, Eastleigh (GB); Christopher J. Poole, Romsey (GB); Martin A. Ross, Gosport (GB); Craig H. Stirling, Winchester (GB)

(73) Assignee: International Business Machines Corporation, Armonk, NY (US)

( * ) Notice: Subject to any disclaimer, the term of this patent is extended or adjusted under 35 U.S.C. 154(b) by 172 days.

This patent is subject to a terminal disclaimer.

(21) Appl. No.: 16/034,772

(22) Filed: Jul. 13, 2018

(65) Prior Publication Data
US 2018/0337689 A1    Nov. 22, 2018

Related U.S. Application Data

(63) Continuation of application No. 14/822,993, filed on Aug. 11, 2015, now Pat. No. 10,056,918.

(30) Foreign Application Priority Data

Aug. 12, 2014    (GB) ...................................... 1414246

(51) Int. Cl.
*H03M 7/30*    (2006.01)
*H04L 12/24*    (2006.01)
(Continued)

(52) U.S. Cl.
CPC ...... *H03M 7/3084* (2013.01); *H04L 41/0604* (2013.01); *H04L 41/0613* (2013.01);
(Continued)

(58) Field of Classification Search
CPC ........... G06F 17/30598; H04L 41/0613; H04L 45/70
See application file for complete search history.

(56) References Cited

U.S. PATENT DOCUMENTS 7,287,097 B1    10/2007    Friend et al.
7,289,964 B1    10/2007    Bowman-Amuah
(Continued)

FOREIGN PATENT DOCUMENTS

CN    101977361 A    2/2011
CN    101243198 A    8/2011
(Continued)

OTHER PUBLICATIONS

Search Report for GB1414246.7 dated Jan. 26, 2015, pp. 1-3.
(Continued)

*Primary Examiner* — Barbara B Anyan
(74) *Attorney, Agent, or Firm* — Heslin Rothenberg Farley & Mesiti P.C.; Michael O'Keefe, Esq.

(57) ABSTRACT

Batch compression management of messages. A message being sent to a batch for transmission is intercepted. The message is assigned to a batch pool, in which multiple batch pools are provided as sub-sets of the batch. The assigning of the message to the batch pool is based on a similarity of properties of the message with other messages and determined by looking up the properties in a batch pool mapping database. The message is added to the batch pool or a new batch pool is created for the message. A batch pool of messages is compressed using a dictionary of the properties
(Continued)

common to at least some of the messages in the batch pool. The compressed batch pools are transmitted over an input/output channel.

19 Claims, 6 Drawing Sheets

(51) Int. Cl.
    *H04M 3/00*     (2006.01)
    *H04L 29/06*     (2006.01)
    *H04M 15/00*     (2006.01)
    *H04L 29/08*     (2006.01)

(52) U.S. Cl.
    CPC ............... *H04M 3/00* (2013.01); *H04L 67/10* (2013.01); *H04L 69/14* (2013.01); *H04L 69/18* (2013.01); *H04M 15/43* (2013.01)

(56) References Cited

U.S. PATENT DOCUMENTS

| | | | |
|---|---|---|---|
| 7,693,492 B2 | 4/2010 | Leung et al. | |
| 2004/0259531 A1* | 12/2004 | Wood | H04W 4/14 455/412.1 |
| 2005/0078660 A1* | 4/2005 | Wood | H04M 15/43 370/352 |
| 2006/0256786 A1 | 11/2006 | Bibr et al. | |
| 2011/0276636 A1* | 11/2011 | Cheng | H04L 69/14 709/206 |
| 2013/0157558 A1* | 6/2013 | Wiatrowski | H04M 3/00 455/3.01 |
| 2014/0085115 A1 | 3/2014 | Beier et al. | |
| 2014/0122735 A1* | 5/2014 | Jokinen | H04L 47/621 709/231 |
| 2015/0370885 A1* | 12/2015 | Kushmerick | G06F 16/353 707/737 |
| 2015/0372855 A1* | 12/2015 | Kushmerick | H04L 67/10 709/224 |
| 2016/0050296 A1 | 2/2016 | Crowther et al. | |

FOREIGN PATENT DOCUMENTS

| | | |
|---|---|---|
| GB | 2391437 A | 2/2004 |
| KR | 1020080067627 A | 7/2008 |
| WO | 2012118591 A1 | 9/2012 |

OTHER PUBLICATIONS

Alves, Pedro, et al., "Context-aware Efficient Message Propagation," Proceedings of the 11th International Workshop on Adaptive and Reflective Middleware, Dec. 2012, pp. 1-6.

Gutwin, Carl, et al. "Improving Network Efficiency in Real-time Groupware with General Message Compression," Proceedings of the 2006 20th Anniversary Conference on Computer Supported Cooperative Work, Nov. 2006, pp. 1-10.

List of IBM Patents or Applications Treated as Related, Jul. 13, 2018, 2 pgs.

* cited by examiner

BATCH COMPRESSION MANAGEMENT OF MESSAGES

PRIOR FOREIGN APPLICATION

This application claims priority from United Kingdom (GB) patent application number 1414246.7, filed Aug. 12, 2014, which is hereby incorporated herein by reference in its entirety.

BACKGROUND

One or more aspects of the invention relate to a field of message transport performance. In particular, one or more aspects of the invention relate to batch compression management of messages.

Message-oriented middleware (MOM) is software and/or hardware architecture which supports sending and receiving of messages between distributed systems. The middleware creates a distributed communications layer that is independent of the various operating systems and network interfaces.

Messaging systems typically provide a function to enable messages to be batched to improve transport overhead and additionally to compress payloads to save on network bandwidth at the expense of processor performance.

MOM systems typically employ a function to improve network and transport performance by optionally compressing messages and batching messages prior to transport. MOM systems also typically process messages that contain a vast majority of similar data. For example, Extensible Markup Language (XML) messages using the same schema will typically share the same XML tags and elements that can account for the majority of certain payloads.

Limitations in the compression of batched messages require higher network bandwidth than required and impact processor performance.

Therefore, there is a need in the art to address the aforementioned problems.

SUMMARY

According to one aspect of the present invention, a computer-implemented method of batch compression management of messages is provided. The method includes intercepting a message being sent to a batch for transmission; assigning the message to a batch pool, wherein multiple batch pools are provided as sub-sets of the batch, and wherein assigning the message to the batch pool is based on a similarity of properties of the message with other messages and determined by looking up message properties in a batch pool mapping database; adding the message to the batch pool or creating a new batch pool for the message; compressing a selected batch pool of messages using a dictionary of properties common to at least some of the messages in the batch pool; and transmitting the compressed batch pool over an input/output channel.

In another aspect of the present invention, a computer program product for batch compression management of messages is provided. The computer program product includes a computer readable storage medium readable by a processing circuit and storing instructions for execution by the processing circuit for performing a method. The method includes intercepting a message being sent to a batch for transmission; assigning the message to a batch pool, wherein multiple batch pools are provided as sub-sets of the batch, and wherein assigning the message to the batch pool is based on a similarity of properties of the message with other messages and determined by looking up message properties in a batch pool mapping database; adding the message to the batch pool or creating a new batch pool for the message; compressing a selected batch pool of messages using a dictionary of properties common to at least some of the messages in the batch pool; and transmitting the compressed batch pool over an input/output channel.

In yet a further aspect of the present invention, a computer system for batch compression management of messages is provided. The computer system includes a memory; and a processing device in communication with the memory, wherein the computer system is configured to perform a method. The method includes intercepting a message being sent to a batch for transmission; assigning the message to a batch pool, wherein multiple batch pools are provided as sub-sets of the batch, and wherein assigning the message to the batch pool is based on a similarity of properties of the message with other messages and determined by looking up message properties in a batch pool mapping database; adding the message to the batch pool or creating a new batch pool for the message; compressing a selected batch pool of messages using a dictionary of properties common to at least some of the messages in the batch pool; and transmitting the compressed batch pool over an input/output channel.

BRIEF DESCRIPTION OF THE DRAWINGS

One or more aspects of the invention are particularly pointed out and distinctly claimed in the concluding portion of the specification. Aspects of the invention, both as to organization and method of operation, together with objects, features, and advantages thereof, may best be understood by reference to the following detailed description when read with the accompanying drawings.

One or more embodiments of the invention will now be described, by way of example only, with reference to the following drawings in which.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

In the following detailed description, numerous specific details are set forth in order to provide a thorough understanding of aspects of the invention. However, it will be understood by those skilled in the art that aspects of the present invention may be practiced without these specific details. In other instances, well-known methods, procedures, and components have not been described in detail so as not to obscure aspects of the present invention.

A method and system are provided for batch compression management of messages. The method applies determination and separation of batched messages to provide an optimal compression and batching messaging system. A batch of messages is separated into batch pools which are batches in their own right. The batch pools may be defined as batches formed of sub-sets of a full batch. The term "batch" should be defined broadly as any group of messages or set of application data. The described method and system may be implemented on a transmission queue, over existing "batching" technology, or potentially in other scenarios.

The method may further include comparison of batching pools as input to combine pools for improved performance.

Figure 1A:
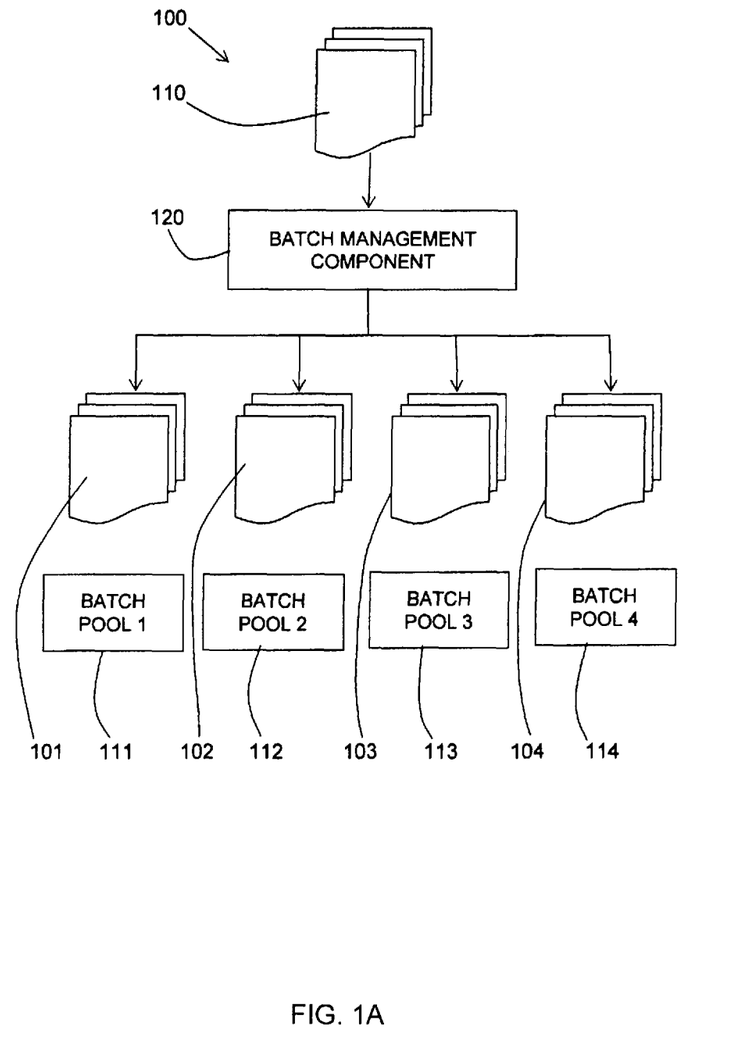
FIG. 1A is a schematic diagram of a system in accordance with an aspect of the present invention.

Referring to FIG. 1A, a schematic diagram 100 shows multiple messages 110 which form a batch which are processed by a batch management component 120. The batch management component 120 processes the messages 110 to assign the messages 101-104 into multiple batch pools 111-114. A batch pool 111-114 may be defined as a group of messages which form a sub-set of a batch of messages. A batch pool 111-114 may be kept in a temporary storage medium which stores the messages assigned to a batch pool while awaiting compression and transmission.

Each batch pool 111-114 is a batch in its own right. A simple example would be that each batch pool would be modelled by a local queue transparently to the user, so there would be one staging/transmission queue for each of these batch pools. When one of the staging/transmission local queues reaches a defined depth (e.g., the size of the batch), all the messages in that staging/transmission local queue are compressed and transmitted across to their intended destination, a target remote queue.

Each batch pool 111-114 is created by the batch management component 120 and messages 110 separated based on significant similarities in properties of the messages 110 such that compression of the messages in the batch pool 111-114 would be improved. In embodiments, messages 110 may be separated based on a similar schema or message model of the messages that results in the messages 110 sharing the similar schema or message model having significant similarities.

Messages having the significant similarities are assigned to the same batch pool 111-114. This results in batch pools 111-114 of messages 101-104 wherein the messages in a particular batch pool are similar, for example, due to a shared message schema, and the batch pool of messages can be efficiently compressed and processed.

The described method creates a new batch pool for each new message which does not fall in a previously defined batch pool 111-114, for example, if the new message has a previously unmet message schema.

When a message is queued to a batch, one embodiment will intercept the message and assign it to the batch pool of similar messages, for example, other messages associated with the same schema. When a particular batch pool is complete, the batch pool will be compressed and processed. As the messages will all share similar data, the compression will be more efficient as they will share a substantially common dictionary. This reduces overhead in the CPU to perform the compression, requires fewer entries in the dictionary, and improves overall compression ratio.

One embodiment of the method additionally compares dictionaries associated with each batch pool, and combines substantially similar batch pools to improve latency and efficiency. This is because having fewer batch pools improves performance and simplicity. In the example of using message schemas to define similarity of messages, initial batch pools may be created for separate schemas but may be combined as although two messages may be conforming to two different schemas; those schemas may share a number of commonalities and schema elements.

To satisfy expected response time criteria, one embodiment of the method may keep track of the arrival time of each message and use "Earliest Deadline First" scheduling to forward the batch pools. Thus, no batch pool will contain messages waiting for extended periods of time waiting for the batch pool to complete. Implementations may provide different logic to manage batch completion.

One example embodiment has three batch pools (A, B, C), the batch size is defined as 10 and each pool has a current depth of 9. The batch pools contain messages that arrived at different times, the earliest arrival times are:

A–12:10:00.01
B–12:10:03.04
C–12:10:02.03

There may be an additional option on the batch pool to define a maximum delay, such that if a batch is not complete once a "max delay" is reached, the batch is sent as is. If the time is now 12:10:05.06 and the max delay is 5 seconds, then batch pool A has now reached that limit and needs to be processed. The system may choose to send that batch as it stands, or it might additionally pick the earliest message from the most similar batch pool to complete the batch of 10 to complete.

In another example embodiment, there may be four batch pools (A, B, C, D). When a batch pool completes, any messages in other batch pools have a counter incremented to indicate they have "missed" a batch. So when batch pool A completes (reaches the batch size), all messages in pools B, C and D have their counters incremented. In an example of a new system, the counters are incremented 0→1. Next, batch pool B completes and sends, so counters for all messages in pools A, C and D are incremented (1→2 for those that were there when A completed, and 0→1 for messages that had arrived post pool A completing). Assume next that pool A has completed first again, but we have messages in pools C and D which have already "missed" 2 batch pools completions—so the management system may prioritize pools C and D now as they contain older messages (either completing them as they are, merging them if appropriate, etc.)

Figure 1B:
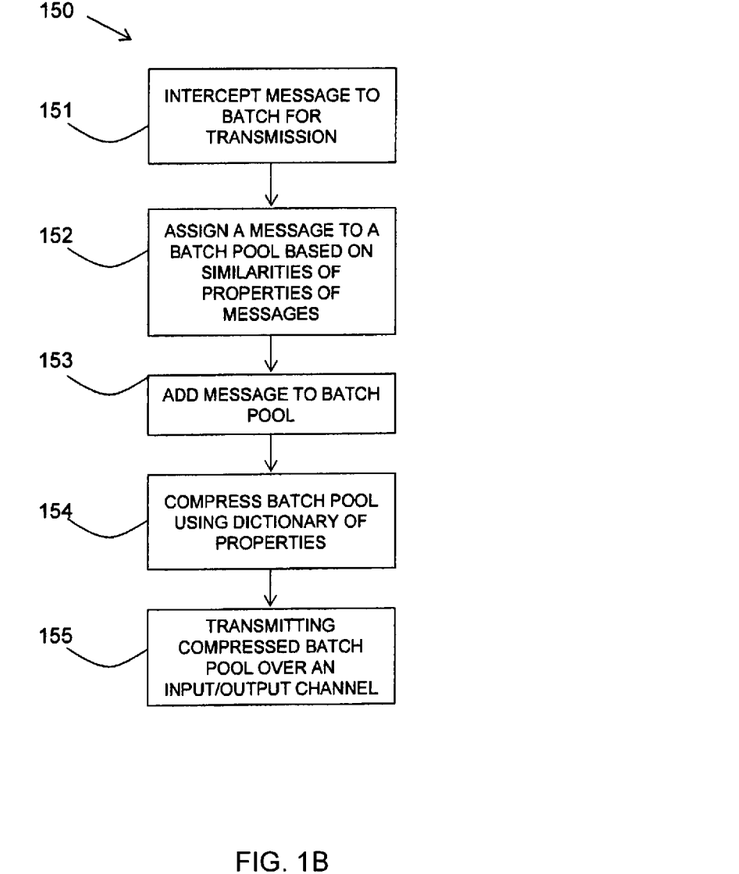
FIG. 1B is a flow diagram of an example embodiment of a method in accordance with an aspect of the present invention.

Referring to FIG. 1B, a flow diagram 150 shows an example embodiment of the described method. A message is intercepted 151 being sent to a batch for transmission.

The message is assigned 152 to a batch pool based on similarities of properties of the message as compared to other messages and determined by looking up properties in a batch pool mapping database. The message is added 153 to a batch pool or a new batch pool is created, if a suitable batch pool does not already exist in the database.

Each batch pool is compressed 154 using a dictionary for the properties of the messages of the batch pool. The dictionary is created specifically for the messages with the defined properties, and therefore, the compression is not a generic compression. The compressed batch pools are transmitted 155 over an input/output channel. The input/output channel may be associated with a network transmission or associated with a persistence to disk.

Figure 2:
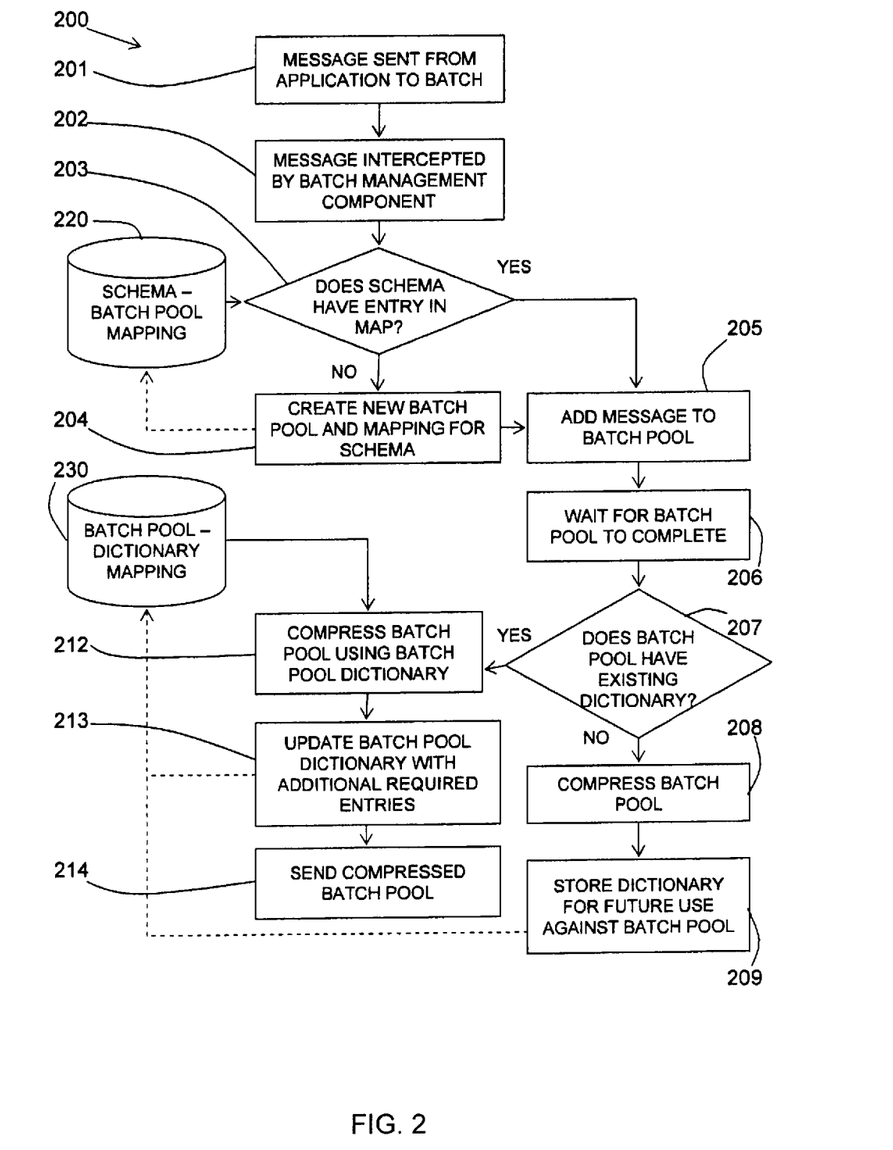
FIG. 2 is a flow diagram of an example embodiment of an aspect of a method in accordance with an aspect of the present invention.

Referring to FIG. 2, a flow diagram 200 illustrates an embodiment of an aspect of the described method of creating batch pools and processing messages to the batch pools. In this embodiment, message schemas are used to determine message similarity.

A message is sent 201 from an application to a batch. The message may be intercepted 202 by a batch management component. The batch management component may carry out the following processing.

It may be determined 203 if the schema of the intercepted message has an entry in a database 220 of schema to batch pool mappings. If there is no existing schema in the mapping database 220, then a new batch pool may be created and a mapping for the schema may be created 204 and stored to the database 220 of schema to batch pool mappings. The message is added 205 to the new batch pool.

If the schema of the intercepted message has an entry in the database 220 of schema to batch pool mappings, then the message is added 205 to the existing batch pool.

The process then waits 206 for the batch to complete. A batch pool may complete when it reaches a defined batch pool size, or according to other completion triggers such as message counters and deadline triggers. In the example completion trigger of a batch pool, the size may be specified by a user, developer or administrator. An example batch pool size may be 10 messages.

It may then be determined 207 if the batch pool has an existing dictionary. If it does not have an existing dictionary, the batch pool is compressed 208 and a dictionary is stored 209 for future use against the batch pool. The dictionary for the batch pool may be added to a database 230 of batch pool to dictionary mappings.

If it is determined that the batch pool has an existing dictionary, then the batch pool is compressed 212 using the pool dictionary as retrieved from the database 230. The batch pool dictionary may be updated 213 with additional required entries which may also be stored to the database 230. The compressed batch pool is then sent 214.

Figure 3:
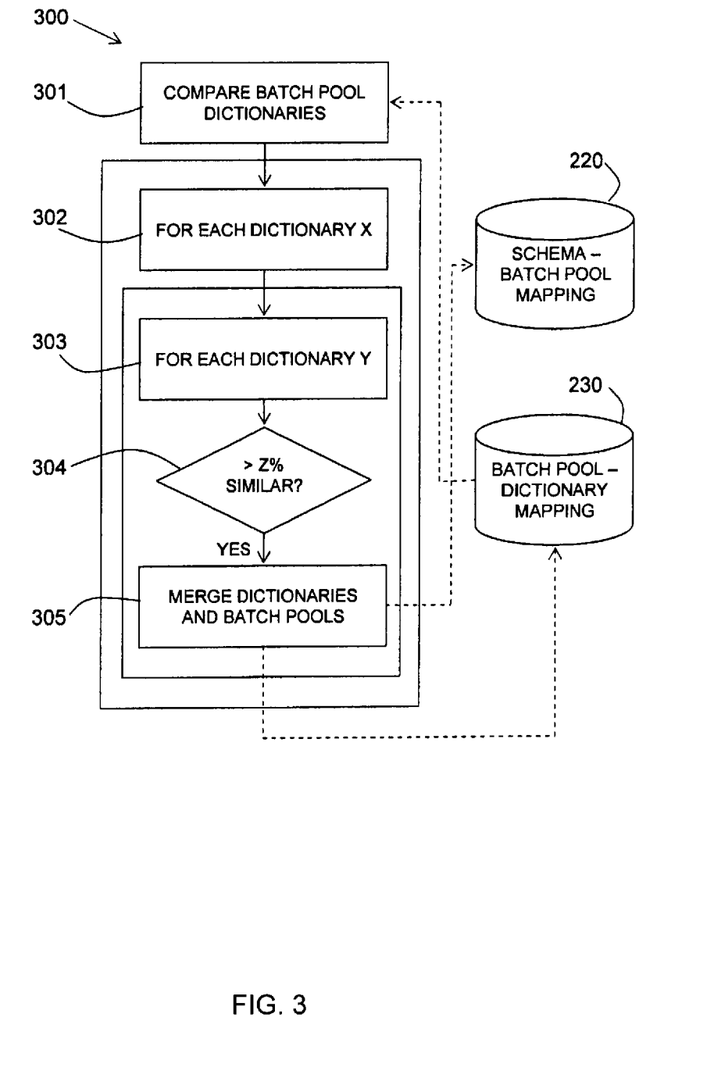
FIG. 3 is a flow diagram of an example embodiment of a further aspect of a method in accordance with an aspect of the present invention.

Referring to FIG. 3, a flow diagram 300 illustrates an embodiment of an aspect of the described method of comparing dictionaries and merging batch pools.

A dictionary is used to map a set of characters to a smaller representation. An example string of "abcdefghi" is used to illustrate this.

The ASCII representation of the string "abcdefghi" is 97|98|99|100|101|102|103|104|105, which in binary would be:
01100001|01100010|01100011|01100100|01100101|0110 0110|01100111|01101000|01101001. This binary representation is 9 bytes long.

A pseudo example dictionary for compressing the string might be:
abc=01
def=10
ghi=11
Then the message compresses as follows:
abcdefghi→011011, which is contained in a single byte as opposed to the previous 9 bytes.

Pool dictionaries are compared 301 from a database 230 of pool to dictionary mappings. Each dictionary X 302 may be compared to each dictionary Y 303, and if it is determined 304 that the dictionaries are similar above a threshold percentage Z, then the dictionaries and pools are merged 305.

The merged dictionaries and batch pools are updated in the batch pool to dictionary mapping database 230 and in the schema to batch pool mapping database 220. The updated batch pool to dictionary mapping database 230 is then used when comparing 301 further dictionaries. After merging, the batch management component will route messages conforming to either schema to that single batch pool. The reference to one of the batch pools may be removed, or both pool artifacts may be removed and a brand new batch pool created.

The dictionary similarity threshold may be user defined or potentially trained by an implementation for optimum level. Existing ranking or comparison technologies may be utilized to perform the comparison.

Implementations may differ in optimization and compression techniques.

Figure 4:
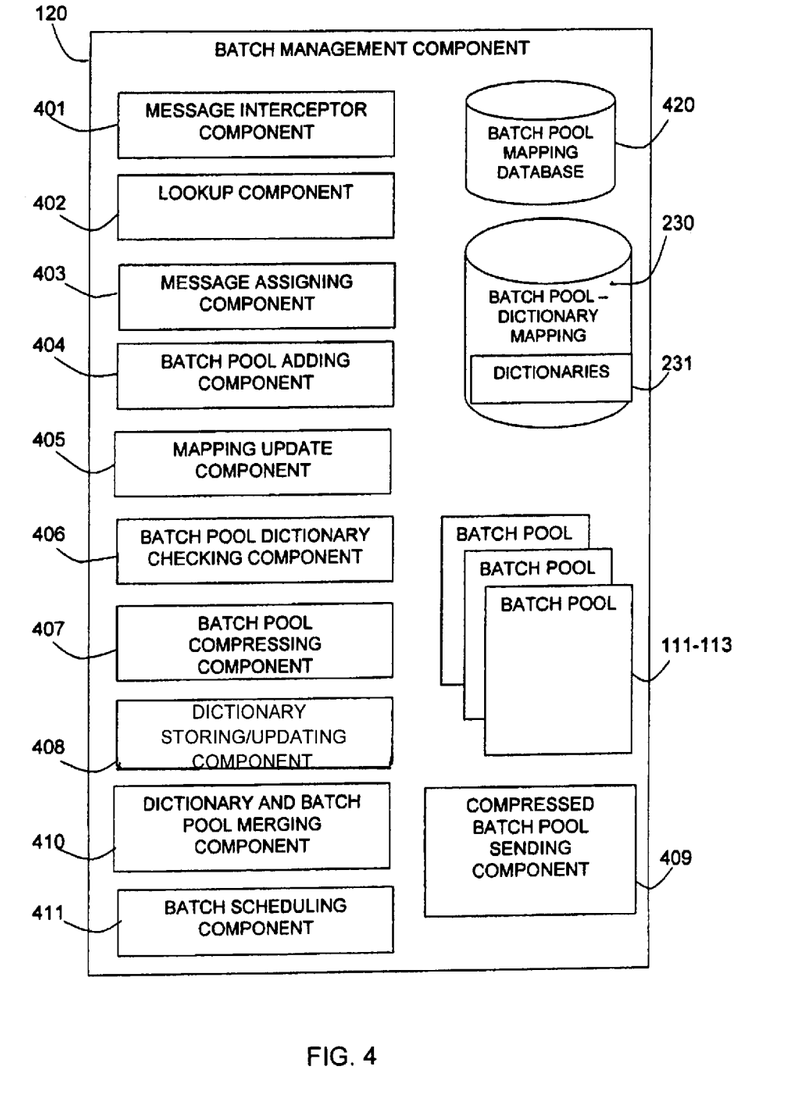
FIG. 4 is block diagram of an example embodiment of a system in accordance with an aspect of the present invention.

Referring to FIG. 4, a block diagram shows an embodiment of the described system.

A batch management component 120 may be provided in a system using batching of messages for transmission. The system may be, for example, a MOM system or a client application that sends/receives messages to or from the MOM. The system may be implemented on a transmission queue, over existing "batching" technology, or potentially in other scenarios.

The batch management component 120 may include a message interceptor component 401 for intercepting messages sent from an application to a batch.

A lookup component 402 may look up a batch pool mapping database 420 which may map a message to a batch pool based on the message properties. In one embodiment, the message properties may be the message schema in a schema to pool mapping database 220 as shown in FIGS. 2 and 3 in order to identify if there is an existing batch pool 111-113 for the message schema.

A message assigning component 403 may assign a message to a batch pool based on its message properties and as determined by the lookup component 402.

A batch pool adding component 404 may create a new batch pool 111-113 if there is no existing batch pool for a message or may add a message to a batch pool 111-113. A mapping update component 405 may update the mapping database 420 with new message properties to batch pool mapping.

A batch pool dictionary checking component 406 may determine if a batch pool 111-113 has a stored dictionary 231 by checking a batch pool to dictionary mapping database 230. A new dictionary may be added or an existing dictionary 231 may be updated in the batch pool to dictionary mapping database 230 by a dictionary storing/updating component 408.

The batch management component 120 may also include a dictionary and batch pool merging component 410 for comparing pool dictionaries from the database 230 and if it is similar above a predefined threshold, then the dictionaries 231 and their mapped batch pools 111-113 may be merged.

A batch scheduling component 411 may monitor parameters, such as the arrival time of messages, the batch pool size, and a counter of times a batch pool has been passed over, and ensures that scheduling forwards batches for sending without waiting for extended periods.

A compressed batch sending component 409 may send the compressed batch pools to an input/output channel either for network transmission or for persistence to a disk.

Figure 5:
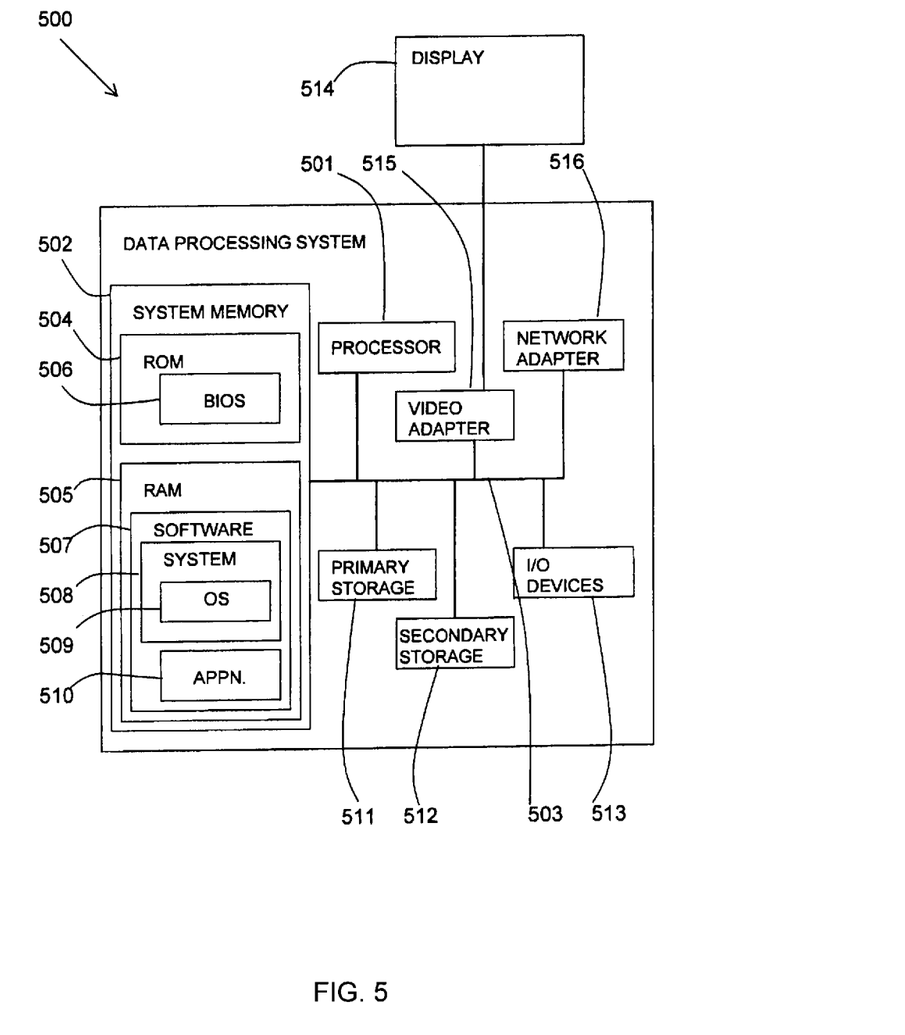
FIG. 5 is a block diagram of an embodiment of a computer system in which one or more aspects of the present invention may be implemented.

Referring to FIG. 5, an exemplary system for implementing aspects of the invention includes a data processing system 500 suitable for storing and/or executing program code including at least one processor 501 coupled directly or indirectly to memory elements through a bus system 503. The memory elements may include local memory employed during actual execution of the program code, bulk storage, and cache memories which provide temporary storage of at least some program code in order to reduce the number of times code is to be retrieved from bulk storage during execution.

The memory elements may include system memory 502 in the form of read only memory (ROM) 504 and random access memory (RAM) 505. A basic input/output system (BIOS) 506 may be stored in ROM 504. Software 507 may be stored in RAM 505, including system software 508, such as operating system software 509. Software applications 510 may also be stored in RAM 505.

The system 500 may also include a primary storage means 511, such as a magnetic hard disk drive and secondary storage means 512, such as a magnetic disc drive and an optical disc drive. The drives and their associated computer-readable media provide non-volatile storage of computer-executable instructions, data structures, program modules and other data for the system 500. Software applications may be stored on the primary and secondary storage means 511, 512, as well as the system memory 502.

The computing system 500 may operate in a networked environment using logical connections to one or more remote computers via a network adapter 516.

Input/output devices 513 may be coupled to the system either directly or through intervening I/O controllers. A user may enter commands and information into the system 500 through input devices, such as a keyboard, pointing device, or other input devices (for example, microphone, joy stick, game pad, satellite dish, scanner, or the like). Output devices may include speakers, printers, etc. A display device 514 is also connected to system bus 503 via an interface, such as video adapter 515.

According to one aspect of the present invention, there is provided a computer-implemented method for batch compression management of messages, comprising: intercepting a message being sent to a batch for transmission; assigning a message to a batch pool wherein multiple batch pools are provided as sub-sets of the batch, and wherein assigning a message to a batch pool is based on a similarity of properties of the message with other messages and determined by looking up the message properties in a batch pool mapping database; adding the message to a batch pool or creating a new batch pool for the message; compressing a batch pool of messages using a dictionary of the properties common to at least some of the messages in the batch pool; and transmitting the compressed batch pool over an input/output channel.

The properties of the message may be a message schema or a message model.

The method may include providing a batch pool to dictionary mapping database and updating the database with new dictionaries for batch pools and updated dictionaries for additional entries. The method may further include: comparing stored dictionaries of batch pools; determining if two dictionaries have a similarity greater than a predefined threshold; and merging dictionaries and their associated batch pools if the similarity is greater than the predefined threshold. The method may further include: updating a batch pool to dictionary mapping database to merge two or more dictionaries by updating two or more batch pool mappings to map to a single dictionary; and merging the two or more batch pools. The predefined threshold may be user defined or machine learned.

The method may include: scheduling a batch pool for compression based on one or more of the group of: monitoring the arrival time of messages and scheduling batch pools according to the earliest arriving messages; monitoring the size of a batch pool and scheduling batch pools according to a predefined maximum batch pool size; and monitoring a count of times a batch pool is passed over for compression and scheduling batch pools according to the highest count.

The input/output channel may be associated with network transmission or may, alternatively, be associated with persistence to a disk.

According to another aspect of the present invention, there is provided a system for batch compression management of messages, comprising: a message interceptor component for intercepting a message being sent to a batch for transmission; a message assigning component for assigning a message to a batch pool wherein multiple batch pools are provided as sub-sets of the batch, and wherein assigning a message to a batch pool is based on similarity of properties of the message with other messages and determined by looking up the message properties in a batch pool mapping database; a batch pool adding component for adding the message to a batch pool or creating a new batch pool for the message; a batch pool compressing component for compressing a batch pool of messages using a dictionary of the properties common to at least some of the messages in the batch pool; and a compressed batch sending component for transmitting the compressed batch pools over an input/output channel.

The system may also include a batch pool to dictionary mapping database and the database is updated with new dictionaries for batch pools and updated dictionaries for additional entries.

The system may further include: a dictionary and batch pool merging component configured to: compare stored dictionaries of batch pools; determine if two dictionaries have a similarity greater than a predefined threshold; and merge dictionaries and their associated batch pools if the similarity is greater than the predefined threshold.

The dictionary and batch pool merging component may be further configured to: update a batch pool to dictionary mapping database to merge two or more dictionaries by updating two or more batch pool mappings to map to a single dictionary; and merge the two or more batch pools.

The system may further include: a batch scheduling component for scheduling a batch pool for compression based on one or more of the group of: monitoring the arrival time of messages and scheduling batch pools according to the earliest arriving messages; monitoring the size of a batch pool and scheduling batch pools according to a predefined maximum batch pool size; and monitoring a count of times a batch pool is passed over for compression and scheduling batch pools according to the highest count.

The input/output channel may be associated with network transmission or may be associated with persistence to a disk.

According to a further aspect of the present invention, there is provided a computer program stored on a computer readable medium and loadable into the internal memory of a digital computer, comprising software code portions, when said program is run on a computer, for performing the method steps of an aspect of the present invention.

According to another aspect of the present invention, there is provided a method substantially as described with reference to the figures.

According to a further aspect of the present invention, there is provided a system substantially as described with reference to the figures.

The described aspects of the invention provide an advantage of utilizing commonalities in message payloads to group messages in batches for improved compression. In this way, implementations take into account the efficiency of compression for batching a subset of messages.

Aspects of the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilising state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Improvements and modifications can be made to the foregoing without departing from the scope of aspects of the present invention.

What is claimed is:

1. A computer-implemented method of batch compression management of messages, comprising:
   intercepting, by one or more processors, in middleware between a first distributed system and a second distributed system, a message comprising a payload originating from the first distributed system being sent to a batch for transmission to the second distributed system;
   assigning, by the one or more processors, based on the payload of the message, the payload comprising a message schema, the message to a batch pool, wherein multiple batch pools are provided as sub-sets of the batch, and wherein assigning the message to the batch pool is based on a similarity of properties of the message with other messages and determined by looking up message properties in a batch pool mapping database, wherein the properties of each message of the message and the other messages comprise a message schema, wherein the similarity of properties of the message with other messages comprise a similarity of the message schema of the message to message schemas of the other messages, based on the message schema of the message and the message schemas of the other messages comprising common extensible markup language (XML) tags and common XML elements that comprise a pre-defined threshold portion of the payload of the message and payloads of the other messages;
   adding, by the one or more processors, the message to the batch pool or creating a new batch pool for the message;
   performing, by the one or more processors, a customized compression on a selected batch pool of messages using a dictionary of properties common to at least some of the messages in the batch pool, wherein the customized compression is an optimized compression that minimizes a number of entries utilized in the dictionary and reduces overhead in the one or more processors, based on the at least some of the messages in the selected pool of messages sharing the dictionary of common properties; and
   transmitting, by the one or more processors, the compressed batch pool over an input/output channel to the second distributed system.

2. The computer-implemented method of claim 1, further including:
   providing a batch pool to dictionary mapping database and updating the batch pool to dictionary mapping database with new dictionaries for batch pools and updated dictionaries for additional entries.

3. The computer-implemented method of claim 2, further including:
   comparing stored dictionaries of batch pools;
   determining whether two dictionaries have a similarity greater than a predefined threshold; and
   merging dictionaries and their associated batch pools based on the similarity being greater than the predefined threshold.

4. The computer-implemented method of claim 3, further including:
   updating the batch pool to dictionary mapping database to merge two or more dictionaries by updating two or more batch pool mappings to map to a single dictionary; and
   merging the two or more batch pools.

5. The computer-implemented method of claim 4, wherein the predefined threshold is user defined or machine learned.

6. The computer-implemented method of claim 1, further including:
   scheduling the selected batch pool for compression based on one or more of:
      monitoring an arrival time of messages and scheduling batch pools according to earliest arriving messages;
      monitoring a size of a batch pool and scheduling batch pools according to a predefined maximum batch pool size; and
      monitoring a count of times a batch pool is passed over for compression and scheduling batch pools according to a highest count.

7. The computer-implemented method of claim 1, wherein the predefined threshold portion comprises a majority of the payloads.

8. A computer program product for batch compression management of messages, comprising:
   a computer readable storage medium readable by a processing circuit and storing instructions for execution by the processing circuit for performing a method comprising:
      intercepting, by one or more processors, in middleware between a first distributed system and a second distributed system, a message comprising a payload originating from the first distributed system being sent to a batch for transmission to the second distributed system;
      assigning, by the one or more processors, based on the payload of the message, the payload comprising a message schema, the message to a batch pool, wherein multiple batch pools are provided as sub-sets of the batch, and wherein assigning the message to the batch pool is based on a similarity of properties of the message with other messages and determined by looking up message properties in a batch pool mapping database, wherein the properties of each message of the message and the other messages comprise a message schema, wherein the similarity of properties of the message with other messages comprise a similarity of the message schema of the message to message schemas of the other messages, based on the message schema of the message and the message schemas of the other messages comprising common extensible markup language (XML) tags and common XML elements that comprise a predefined threshold portion of the payload of the message and payloads of the other messages;
      adding, by the one or more processors, the message to the batch pool or creating a new batch pool for the message;
      performing, by the one or more processors, a customized compression on a selected batch pool of messages using a dictionary of properties common to at least some of the messages in the batch pool, wherein the customized compression is an optimized compression that minimizes a number of entries utilized in the dictionary and reduces overhead in the one or more processors, based on the at least some of the messages in the selected pool of messages sharing the dictionary of common properties; and
      transmitting, by the one or more processors, the compressed batch pool over an input/output channel to the second distributed system.

9. The computer program product of claim 8, wherein the method further comprises:
   providing a batch pool to dictionary mapping database and updating the batch pool to dictionary mapping database with new dictionaries for batch pools and updated dictionaries for additional entries.

10. The computer program product of claim 9, further comprising:
    comparing stored dictionaries of batch pools;
    determining whether two dictionaries have a similarity greater than a predefined threshold; and
    merging dictionaries and their associated batch pools based on the similarity being greater than the predefined threshold.

11. The computer program product of claim 10, wherein the method further comprises:
    updating the batch pool to dictionary mapping database to merge two or more dictionaries by updating two or more batch pool mappings to map to a single dictionary; and
    merging the two or more batch pools.

12. The computer program product of claim 8, wherein the method further comprises:
    scheduling the selected batch pool for compression based on one or more of:
        monitoring an arrival time of messages and scheduling batch pools according to earliest arriving messages;
        monitoring a size of a batch pool and scheduling batch pools according to a predefined maximum batch pool size; and
        monitoring a count of times a batch pool is passed over for compression and scheduling batch pools according to a highest count.

13. A computer system for batch compression management of messages, comprising:
    a memory; and
    a processing device comprising one or more processors in communication with the memory, wherein the computer system is configured to perform a method, said method comprising:
        intercepting, by the one or more processors, in middleware between a first distributed system and a second distributed system, a message comprising a payload originating from the first distributed system being sent to a batch for transmission to the second distributed system;
        assigning, by the one or more processors, based on the payload of the message, the payload comprising a message schema, the message to a batch pool, wherein multiple batch pools are provided as subsets of the batch, and wherein assigning the message to the batch pool is based on a similarity of properties of the message with other messages and determined by looking up message properties in a batch pool mapping database, wherein the properties of each message of the message and the other messages comprise a message schema, wherein the similarity of properties of the message with other messages comprise a similarity of the message schema of the message to message schemas of the other messages, based on the message schema of the message and the message schemas of the other messages comprising common extensible markup language (XML) tags and common XML elements that comprise a predefined threshold portion of the payload of the message and payloads of the other messages;
        adding, by the one or more processors, the message to the batch pool or creating a new batch pool for the message;
        performing, by the one or more processors, a customized compression on a selected batch pool of messages using a dictionary of properties common to at least some of the messages in the batch pool, wherein the customized compression is an optimized compression that minimizes a number of entries utilized in the dictionary and reduces overhead in the processing device, based on the at least some of the messages in the selected pool of messages sharing the dictionary of common properties; and
        transmitting, by the one or more processors, the compressed batch pool over an input/output channel to the second distributed system.

14. The computer system of claim 13, wherein the properties of the message are at least one of a message schema or a message model.

15. The computer system of claim 13, wherein the method further comprises:
    providing a batch pool to dictionary mapping database and updating the batch pool to dictionary mapping database with new dictionaries for batch pools and updated dictionaries for additional entries.

16. The computer system of claim 15, wherein the method further comprises:
    comparing stored dictionaries of batch pools;
    determining whether two dictionaries have a similarity greater than a predefined threshold; and
    merging dictionaries and their associated batch pools based on the similarity being greater than the predefined threshold.

17. The computer system of claim 16, wherein the method further comprises:
    updating the batch pool to dictionary mapping database to merge two or more dictionaries by updating two or more batch pool mappings to map to a single dictionary; and
    merging the two or more batch pools.

18. The computer system of claim 13, wherein the method further comprises:
    scheduling the selected batch pool for compression based on one or more of:
        monitoring an arrival time of messages and scheduling batch pools according to earliest arriving messages;
        monitoring a size of a batch pool and scheduling batch pools according to a predefined maximum batch pool size; and
        monitoring a count of times a batch pool is passed over for compression and scheduling batch pools according to a highest count.

19. The computer system of claim 13, wherein the predefined threshold portion comprises a majority of the payloads.

* * * * *